US010784332B2

(12) United States Patent
Li et al.

(10) Patent No.: US 10,784,332 B2
(45) Date of Patent: Sep. 22, 2020

(54) METHODS FOR PRODUCING INTEGRATED CIRCUITS WITH MAGNETS AND A WET ETCHANT FOR THE SAME

(71) Applicant: Globalfoundries Singapore Pte. Ltd., Singapore (SG)

(72) Inventors: Liang Li, Singapore (SG); Yun Ling Tan, Singapore (SG); Kai Hung Alex See, Singapore (SG); Lulu Peng, Singapore (SG); Donald Ray Disney, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 91 days.

(21) Appl. No.: 15/928,239

(22) Filed: Mar. 22, 2018

(65) Prior Publication Data

US 2019/0296100 A1  Sep. 26, 2019

(51) Int. Cl.
*H01L 49/02* (2006.01)
*H01F 41/02* (2006.01)
*C09K 13/08* (2006.01)
*C23F 1/26* (2006.01)
*C23F 1/30* (2006.01)
*H01F 41/04* (2006.01)

(52) U.S. Cl.
CPC .............. *H01L 28/10* (2013.01); *C09K 13/08* (2013.01); *C23F 1/26* (2013.01); *C23F 1/30* (2013.01); *H01F 41/02* (2013.01); *H01F 41/04* (2013.01)

(58) Field of Classification Search
CPC ................. H01F 41/02; H01F 17/0013; H01F 2017/0066
See application file for complete search history.

(56) References Cited

U.S. PATENT DOCUMENTS

| 6,783,694 B1 * | 8/2004 | Lee .......................... C23F 1/28 252/79.1 |
| 2016/0043304 A1 * | 2/2016 | Chen ....................... H01L 43/08 257/421 |
| 2019/0006455 A1 * | 1/2019 | Ku .......................... H01L 28/10 |

* cited by examiner

*Primary Examiner* — Jay C Chang
*Assistant Examiner* — Mikka Liu
(74) *Attorney, Agent, or Firm* — Thompson Hine LLP

(57) ABSTRACT

Integrated circuits and methods of producing the same are provided. In an exemplary embodiment, a method of producing an integrated circuit includes forming a lower conductor element overlying a substrate, and forming a magnetic stack layer overlying the lower conductor element. A waste portion of the magnetic stack layer is removed with a wet etchant to produce a magnetic core. The wet etchant includes hydrofluoric acid, a second acid different than the hydrofluoric acid, an oxidizer, and a solvent.

18 Claims, 7 Drawing Sheets

METHODS FOR PRODUCING INTEGRATED CIRCUITS WITH MAGNETS AND A WET ETCHANT FOR THE SAME

TECHNICAL FIELD

The technical field generally relates to integrated circuits with magnets, methods of producing the same, and a wet etchant, and more particularly relates to methods of producing integrated circuits with magnets that are selectively etched in a single step, and an etchant for the same.

BACKGROUND

Off-chip magnets are included in some devices, such as mobile devices, where the magnets may be utilized for power circuits, inductors, transformers, or other purposes. However, such off-chip magnets are typically bulky and expensive to incorporate into the device. As switching frequency increases with newer electronic devices, the required inductance value for a power circuit magnet is reduced. For example, with switching frequencies approaching 20 megahertz, the inductance value may be as low as a few hundred nanohenries. This low value makes on-chip magnets feasible.

One option for producing on-chip magnets includes forming a magnetic core surrounded by a conductive coil. When a current is passed through the coil, the magnetic core is magnetized. However, the magnetic core tends to be about 1 to about 10 microns thick, and the magnetic core needs to be formed into the desired shape at the desired position within the integrated circuit. Etching techniques for forming the magnetic core are challenging, because of the thickness and the composition.

Accordingly, it is desirable to provide integrated circuits with magnetic cores and associated coils, and methods of producing the same. In addition, it is desirable to provide etching techniques and etchants for forming integrated circuits with magnets, where the etching process is economical and efficient. Furthermore, other desirable features and characteristics of the present embodiments will become apparent from the subsequent detailed description and the appended claims, taken in conjunction with the accompanying drawings and this background.

BRIEF SUMMARY

Integrated circuits and methods of producing the same are provided. In an exemplary embodiment, a method of producing an integrated circuit includes forming a lower conductor element overlying a substrate, and forming a magnetic stack layer overlying the lower conductor element. A waste portion of the magnetic stack layer is removed with a wet etchant to produce a magnetic core. The wet etchant includes hydrofluoric acid, a second acid different than the hydrofluoric acid, an oxidizer, and a solvent.

A method of producing an integrated circuit is provided in another exemplary embodiment. The method includes forming a lower conductor element overlying a substrate, and forming an etch stop layer overlying the lower conductor element. A magnetic stack layer is formed overlying the lower conductor element, and a magnet photoresist layer is patterned overlying the magnetic stack layer. The magnetic stack layer is etched in a single wet etch to selectively remove all of a waste portion of the magnetic stack layer and to produce a magnetic core. The magnetic core underlies the magnet photoresist layer. The magnet photoresist layer and the etch stop layer survive the etching of the magnetic stack layer.

A wet etchant is provided in another exemplary embodiment. The wet etchant includes hydrofluoric acid and a second acid different than the hydrofluoric acid. The second acid is selected from hydrochloric acid, sulfuric acid, and combinations thereof. The wet etchant also includes an oxidizer and a solvent, where the oxidizer is selected from hydrogen peroxide, nitric acid, and combinations thereof. The solvent is selected from water, methanol, ethanol, propanol, butanol, pentanol, ethylene glycol, propylene glycol, and combinations thereof. A hydrofluoric/solvent ratio is a ratio of a weight of the hydrofluoric acid to a weight of the solvent in the wet etchant, and the hydrofluoric/solvent ratio is from about 1:10 to about 1:200. An oxidizer ratio is a ratio of a sum of the weight of the second acid and the oxidizer to the weight of the solvent in the wet etchant, and the oxidizer ratio is from about 2:5 to about 2:100.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and processes described herein may be incorporated into a more comprehensive procedure having additional processes or functionality not described in detail herein. In particular, various processes in the manufacture of integrated circuits are well-known and so, in the interest of brevity, many conventional processes will only be mentioned briefly herein or will be omitted entirely without providing the well-known process details.

An integrated circuit includes a magnetic core positioned between a lower conductor element and an upper conductor element, where the upper and lower conductor elements are portions of a conductive coil wrapped around the magnetic core. The magnetic core includes a plurality of magnetic sub layers sandwiched between interface layers, such that the magnetic core is from about 1 to about 10 microns thick. The magnetic core is formed by a single selective wet etch of a magnetic stack layer using a wet etchant that is formulated for the selective etch. The wet etchant includes hydrofluoric acid, a second acid different than the hydrofluoric acid, an oxidizer, and a solvent, where the ratios of the components within the wet etchant are selected such that the wet etchant effectively removes a waste portion of the magnetic stack layer while a magnetic photoresist layer, an etch stop layer, and a base dielectric layer survive.

Figure 1:
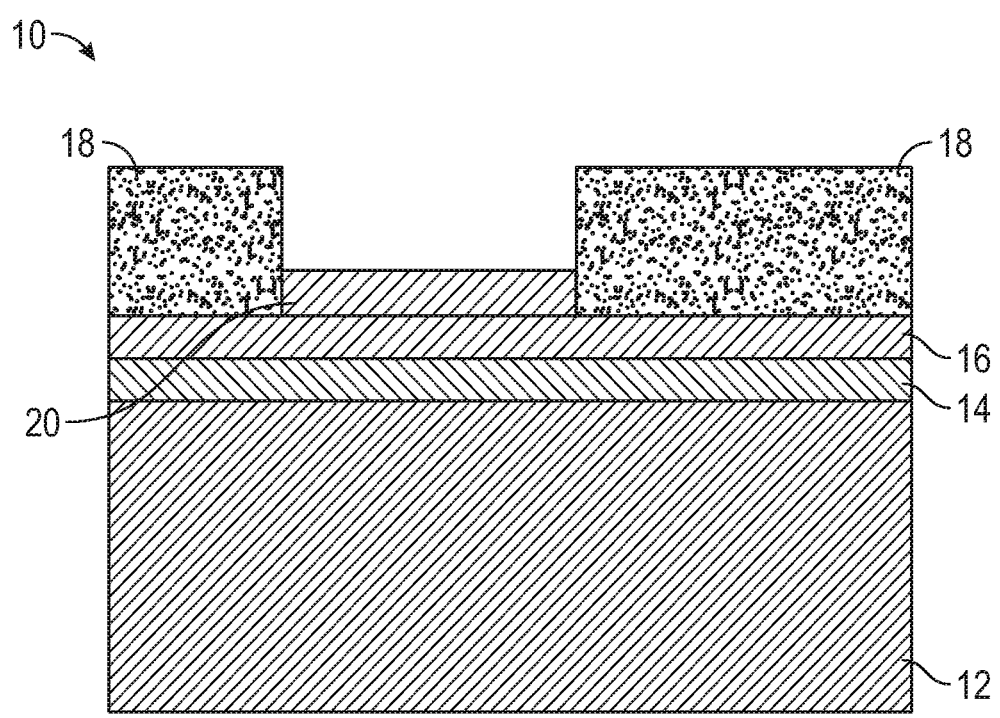
FIGS. 1-9 are cross sectional views of embodiments of an integrated circuit, and methods for producing the same.

Referring to an exemplary embodiment illustrated in FIG. 1, an integrated circuit 10 includes a substrate 12 formed of a semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 10 weight percent or more based on the total weight of the referenced component or material, unless otherwise indicated. In many embodiments, the substrate 12 primarily includes a monocrystalline semiconductor material. The term "primarily includes," as used herein, means the specified material is present in the specified component at a concentration of at least about 50 weight percent, based on a total weight of the component. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

The embodiment currently illustrated depicts the magnetic device described more fully below being formed very close to the substrate 12, but in alternate embodiments the magnetic device may be formed at other locations within the integrated circuit 10. For example, one, two, or more inter-layer dielectric layers (not illustrated) may be formed between the substrate 12 and the magnetic device, and a wide range of electronic components may be formed under or over the magnetic device, such as transistors, capacitors, resistors, etc. As such, the close proximity of the substrate 12 and the magnetic device as illustrated is not intended to limit the position of the magnetic device.

An optional substrate cover layer 14 is formed overlying the substrate 12 in the illustrated embodiment, where the substrate cover layer 14 may be formed of an insulating material such as silicon dioxide. The substrate cover layer 14 may be formed by oxidizing the surface of the substrate, or by depositing the substrate cover layer 14 in various embodiments. Silicon dioxide may be deposited by chemical vapor deposition using silane and oxygen, but many other techniques or materials may be utilized in alternate embodiments. As used herein, the term "overlying" means "over" such that an intervening layer may lie between the overlying component (the substrate cover layer 14 in this example) and the underlying component (the substrate 12 in this example), or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, and the integrated circuit 10 can be operated in any orientation. Spatially relative terms, such as "top", "bottom", "over" and "under" are made in the context of the orientation of the FIGS. It is to be understood that spatially relative terms refer to the orientation in the figures, so if the integrated circuit 10 were to be oriented in another manner the spatially relative terms would still refer to the orientation depicted in the figures. Thus, the exemplary terms "over" and "under" remain the same even if the device is twisted, flipped, or otherwise oriented other than as depicted in the figures.

A seed layer 16 is formed overlying the substrate 12 and the optional substrate cover layer 14 in an exemplary embodiment. The seed layer 16 may include two or more separate layers (not individually illustrated), such as a first portion that includes titanium, tantalum or other materials, and another layer that includes copper. The titanium and copper of the seed layer 16 may be sequentially deposited by physical vapor deposition, but other deposition techniques or seed layer structures are also possible.

A lower conductor photoresist layer 18 may then be formed and patterned overlying the seed layer 16. The lower conductor photoresist layer 18 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the lower conductor photoresist layer 18 remains overlying the other areas of the seed layer 16. The lower conductor photoresist layer 18 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamido-titanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane.

A lower conductor element 20 is formed overlying the seed layer 16, the substrate cover layer 14, and the substrate 12, where the lower conductor element 20 is formed of an electrically conductive material. As used herein, an "electrically insulating material" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from about more than $1 \times 10^{-4}$ ohm meters to less than about $1 \times 10^4$ ohm meters. In an exemplary embodiment, the lower conductor element 20 includes copper, which can be deposited by electroless deposition or by electroplating in a sulfuric acid bath with copper sulfate. Other deposition techniques or materials are possible in alternate embodiments. The copper adheres to the seed layer 16, so the copper is formed in the opening patterned within the lower conductor photoresist layer 18. The lower conductor photoresist layer 18 may be removed after the lower conductor element 20 is formed, such as with an oxygen containing plasma. Once the lower conductor photoresist layer 18 is removed, the exposed portion of the seed layer 16 may be removed, such as with a dilute phosphoric acid wet etch followed by a dilute hydrofluoric acid wet etch.

Figure 2:
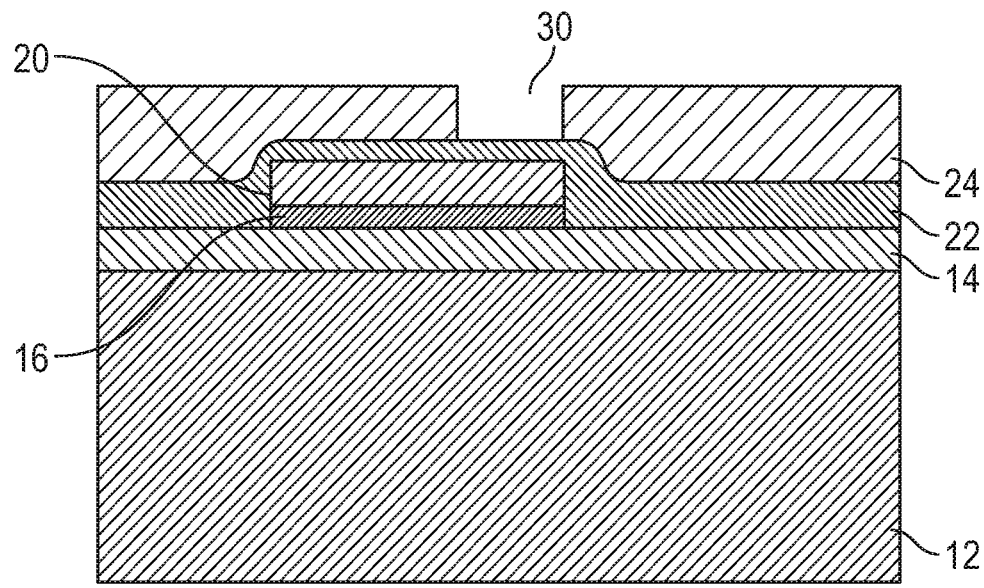

An etch stop layer 22 is formed overlying the lower conductor element 20 and the substrate 12 (including the substrate cover layer 14), as illustrated in an embodiment in FIG. 2. The material for the etch stop layer 22 is selected to resist etching from a wet etchant described below. In an exemplary embodiment, the etch stop layer 22 includes silicon nitride, which may be deposited by reacting ammonia and dichlorosilane using lower pressure chemical vapor deposition. A base dielectric layer 24 is then formed overlying the etch stop layer 22, where the base dielectric layer 24 is an electrical insulator. The material of the base dielectric layer 24 is also selected to resist etching from the wet etchant described more fully below. In an exemplary embodiment, the base dielectric layer 24 primarily includes an organic compound, such as a photosensitive polyimide, sometimes referred to as a PSPI. The PSPI may be applied by spinning on, and then patterned to open a via 30 that passes through the base dielectric layer 24. Only one via 30 in the base dielectric layer 24 is illustrated for simplicity in this description, but it should be understood that a plurality of vias 30 are formed, where these vias 30 will eventually be filled to serve as part of a coil wrapping around a magnetic core described below. The base dielectric layer 24 may be formed of other materials in alternate embodiments. The base dielectric layer 24 may be cured after the via 30 is formed, such as by annealing at from about 300 degrees Celsius (° C.) to about 400° C.

Figure 3:
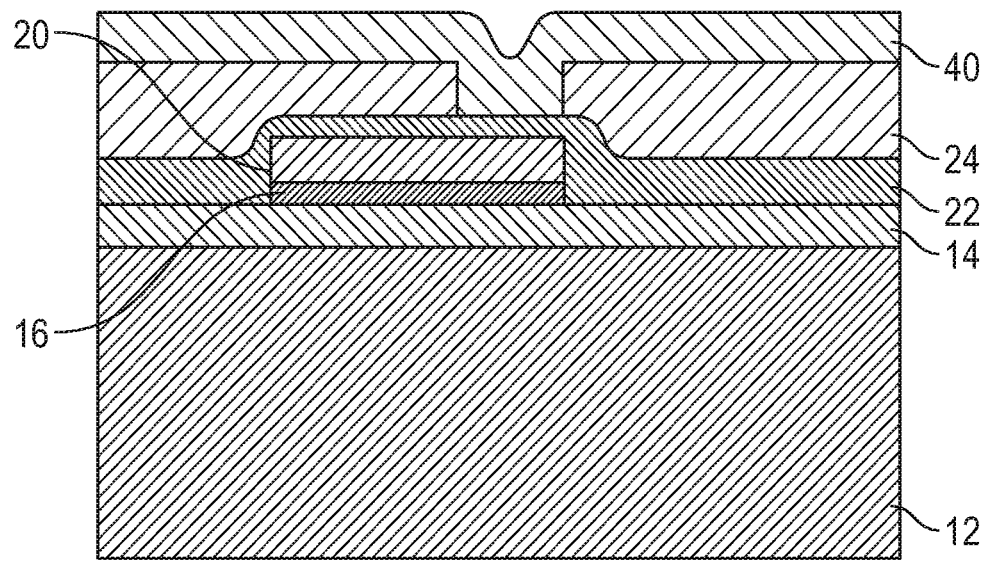
Figure 4:
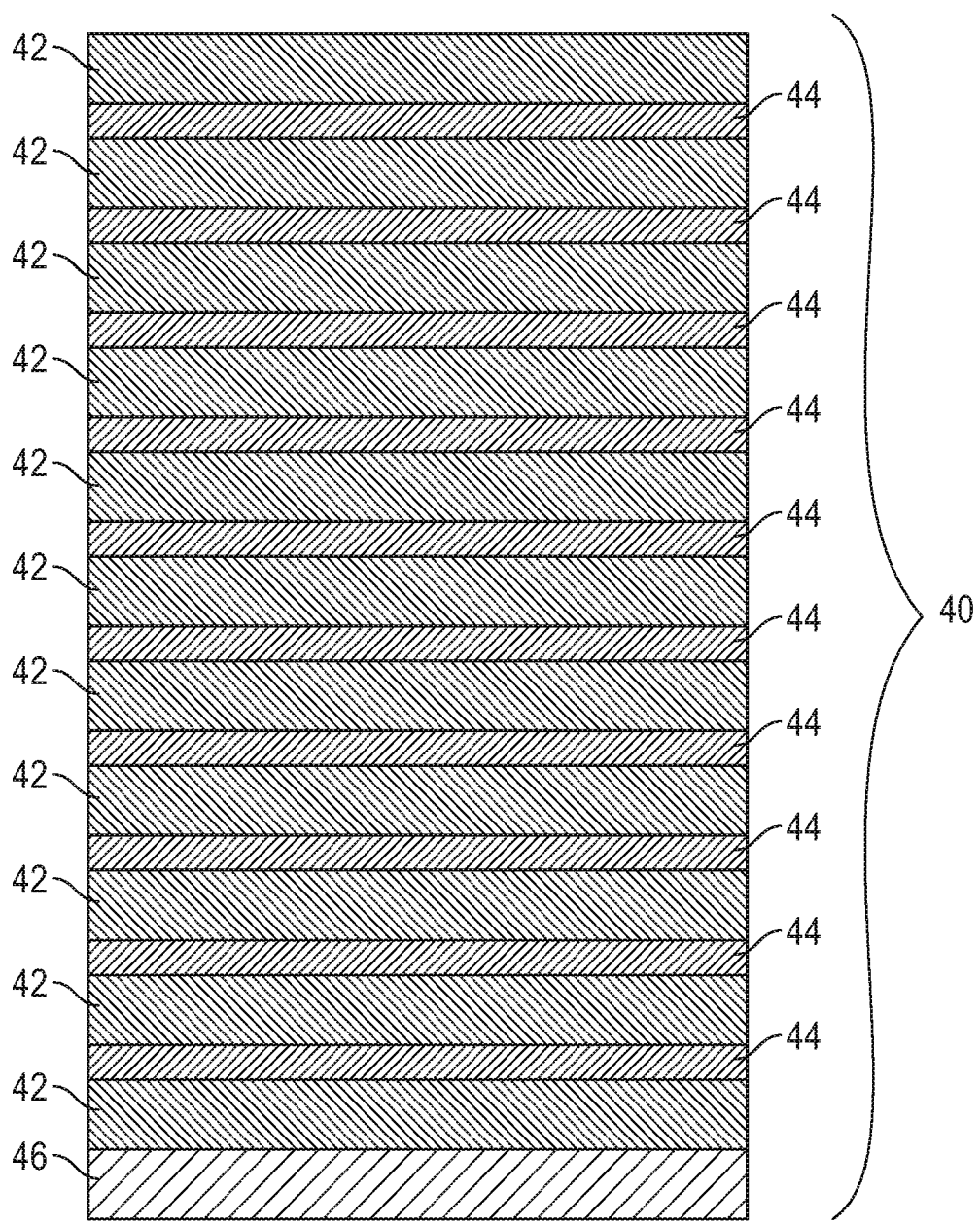

Referring to an embodiment illustrated in FIG. 3, a magnetic stack layer 40 is formed overlying the base dielectric layer 24 and the lower conductor element 20. As such, the base dielectric layer 24 is between the magnetic stack layer 40 and at least a portion of the lower conductor element 20. The magnetic stack layer 40 includes from about 4 to about 24 magnetic sub layers 42 alternating with from about 4 to about 24 interface layers 44, as illustrated in FIG. 4 with continuing reference to FIG. 3. The embodiment illustrated in FIG. 3 shows the magnetic stack layer 40 as being a single layer, but in fact the magnetic stack layer 40 includes a plurality of layers as shown in FIG. 4. The magnetic stack layer 40 is formed such that the interior magnetic sub layers 42 are sandwiched between interface layers 44 and the interior interface layers 44 are sandwiched between magnetic sub layers 42. Therefore, the magnetic sub layers 42 and the interface layers 44 alternate in the magnetic stack layer 40.

A glue layer 46 may be utilized as the bottom layer of the magnetic stack layer 40, where the glue layer 46 may be formed from titanium. In an exemplary embodiment, the glue layer 46 primarily includes titanium, which may be deposited by physical vapor deposition. The magnetic sub layers 42 and alternating interface layers 44 may be formed overlying the glue layer 46.

The magnetic sub layers 42 include cobalt, zirconium, and tantalum, and may optionally include boron or other elements in some embodiments. The magnetic sub layers 42 are formed by sputtering the elements to form an alloy or by forming successive layers, where the magnetic sub layers 42 may be amorphous. In embodiments where the magnetic sub layers 42 are amorphous, the magnetic sub layers are not permanent magnets. The interface layers 44 include an interface layer material, where the interface layer material is selected from silicon oxide, aluminum nitride, cobalt oxide, or a combination thereof. Other materials may be used in alternate embodiments. Silicon oxide deposition has been described above, and aluminum nitride may be deposited by sputtering. Each of the magnetic sub layers 42 may be from about 250 to about 500 nanometers thick, and each of the interface layers 44 may be from about 5 to about 50 nanometers thick, and the entire magnetic stack layer 40 may be from about 2 to about 6 microns thick.

Figure 5:
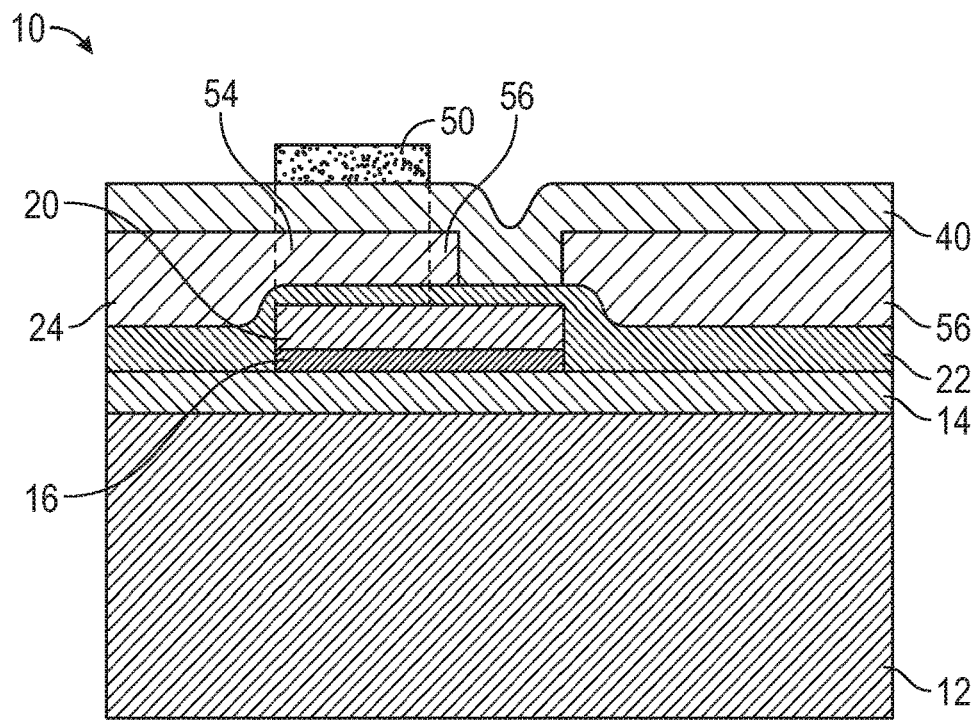
Figure 6:
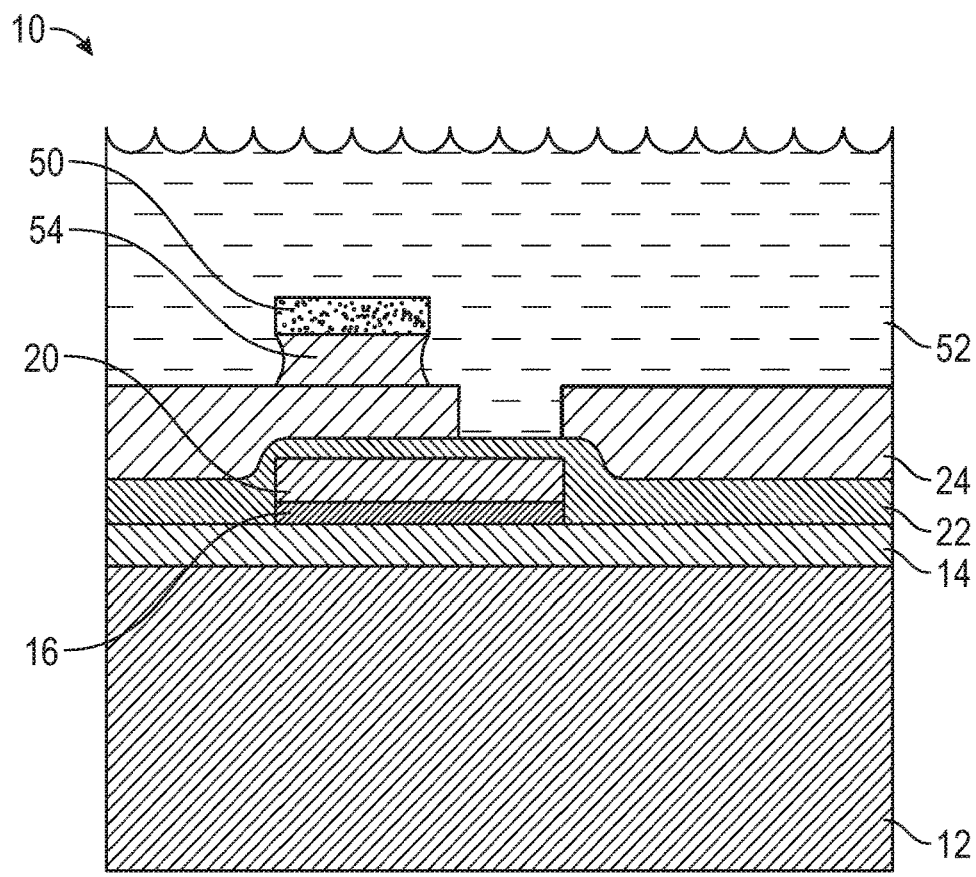

Once the magnetic stack layer 40 is formed, a magnet photoresist layer 50 is formed and patterned overlying the magnetic stack layer 40, as illustrated in FIG. 5. The magnet photoresist layer 50 may include diazonaphthoquinone and a phenolic resin, but other types of photoresist may be utilized in alternate embodiments. Referring to an exemplary embodiment in FIG. 6, with continuing reference to FIG. 5, the magnetic stack layer 40 is then selectively etched in a single wet etch using a wet etchant 52, including the glue layer 46 of the magnetic stack layer 40. The magnet photoresist layer 40, the base dielectric layer 24, and the etch stop layer 22 all survive the selective etching of the magnetic stack layer 40, where "survive" means at least some portion of the named layer remains and there are no holes etched completely through the named layer during the selective etch process. The portion of the magnetic stack layer 40 underlying the magnet photoresist layer 50 survives the selective etching to produce a magnetic core 54 underlying the patterned magnet photoresist layer 50. The magnetic core 54 may include dished or undercut side walls, due to the wet etch process, but the magnetic core 54 remains after the selective etch. The magnetic core 54 overlies the lower conductor element 20. The selective etch removes a waste portion of the magnetic stack layer 56, where the waste portion of the magnetic stack layer 56 is completely removed by the selective wet etch. In some embodiments, the waste portion of the magnetic stack layer 56 is completely removed in a single wet etch, as opposed to repeated wet etches.

The wet etchant 52 utilized for the selective etch of the magnetic stack layer 40 is formulated to completely remove the waste portion of the magnetic stack layer 56 without completely removing the magnet photoresist layer 50, the base dielectric layer 24, the etch stop layer 22, or other desired components that may be exposed to the wet etchant 52. The selective wet etch may be performed for a period of from about 2 to about 60 minutes in various embodiments, and the selective wet etch may be performed at moderate temperatures, such as from about 20 to about 70° C. The wet etchant 52 include several components, and the ratios of those components are set to provide the desired etch rate and etch selectivity. In an exemplary embodiment, the wet etchant 52 includes hydrofluoric acid (HF), a second acid different than the hydrofluoric acid, an oxidizer, and a solvent. The second acid is selected from the group of hydrochloric acid (HCl), sulfuric acid ($H_2SO_4$), and combinations thereof. The oxidizer is selected from the group of hydrogen peroxide ($H_2O_2$), nitric acid ($HNO_3$), and combinations thereof, and the solvent is selected from the group of water, methanol, ethanol, propanol, butanol, pentanol, ethylene glycol, propylene glycol, and combinations thereof. In an exemplary embodiment, the second acid is hydrochloric acid, the oxidizer is hydrogen peroxide, and the solvent is water.

The ratios of the constituents are important for the proper etch rate and selectivity. A hydrofluoric/solvent ratio is a ratio of a weight of the hydrofluoric acid to a weight of the solvent in the wet etchant. The hydrofluoric/solvent ratio is from about 1:10 to about 1:200, or from about 1:50 to about 1:150, or from about 1:80 to about 1:120, in various embodiments. If the hydrofluoric/solvent ratio is greater than about 1:10, the etch stop layer 22 may be completely removed during the selective etch, or other desired layers may not survive the etch. If the hydrofluoric/solvent ratio is less than about 1:200, the time required to completely remove the waste portion of the magnetic stack layer 40 is too long for an acceptable production process, such as more than about 15 minutes. An oxidizer ratio is a ratio of a sum of the weight of the second acid and the oxidizer to the weight of the solvent, so the weight of the second acid and the weight of the oxidizer are added, and this sum is compared to the weight of the solvent. In an exemplary embodiment, the oxidizer ratio is from about 2:5 to about 2:100, or from about 1:5 to about 4:100, or from about 6:100 to about 1:10 in various embodiments. If the oxidizer ratio is greater than about 2:5, the magnetic core is severely undercut or removed to the point that functionality may be compromised. However, if the oxidizer ratio is less than about 2:100, the time required to completely remove the waste portion of the magnetic stack layer 40 is too long for an acceptable production process, and manufacturing cycle times are compromised.

Figure 7:
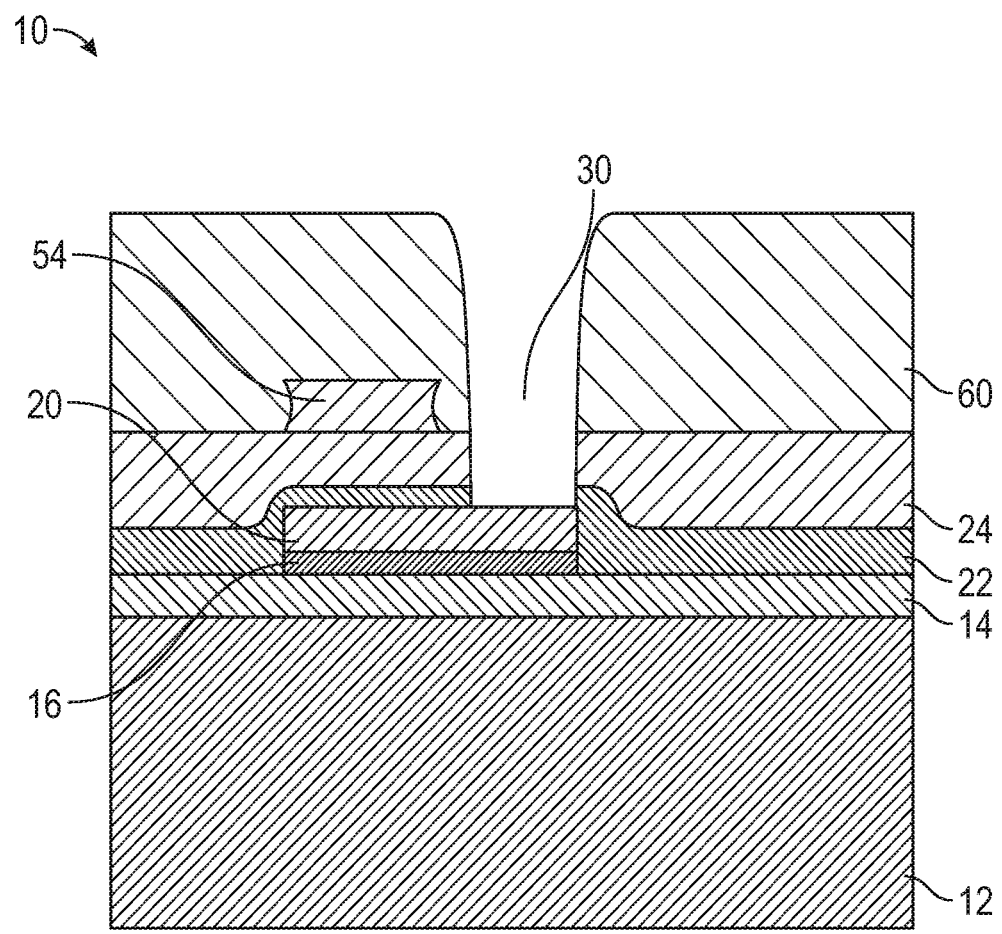

Referring to an exemplary embodiment in FIG. 7, an interlayer dielectric layer 60 is formed overlying the base dielectric layer 24, where the interlayer dielectric layer 60 is an electrical insulator. The interlayer dielectric layer 60 covers the top and sides of the magnetic core 54. The interlayer dielectric layer 60 includes the PSPI material in an exemplary embodiment, as described above. The PSPI material is a type of photoresist material, so the interlayer dielectric layer 60 is patterned to form the via 30 directly overlying and joining the via 30 that was previously formed and illustrated in FIG. 2. Once the via 30 is formed, the PSPI material of the interlayer dielectric layer 60 is cured, such as with an anneal at from about 300 to about 400° C., as described above. The interlayer dielectric layer 60 and the base dielectric layer 24 both include cured PSPI material in an exemplary embodiment, such that these layers may essentially merge into a single layer. However, the interlayer dielectric layer 60 and the base dielectric layer 24 are formed separately, and therefore are illustrated and labeled as separate layers herein. The via 30 may be extended through the etch stop layer 22, such as with a wet etch using hot phosphoric acid in embodiments where the etch stop layer 22 includes silicon nitride. Alternatively, the etch stop layer 22 may be removed with a reactive ion etch using hydrogen an nitrogen trifluoride, but other etchants or techniques may also be utilized. As such, the via 30 extends to the lower conductor element 20.

Figure 8:
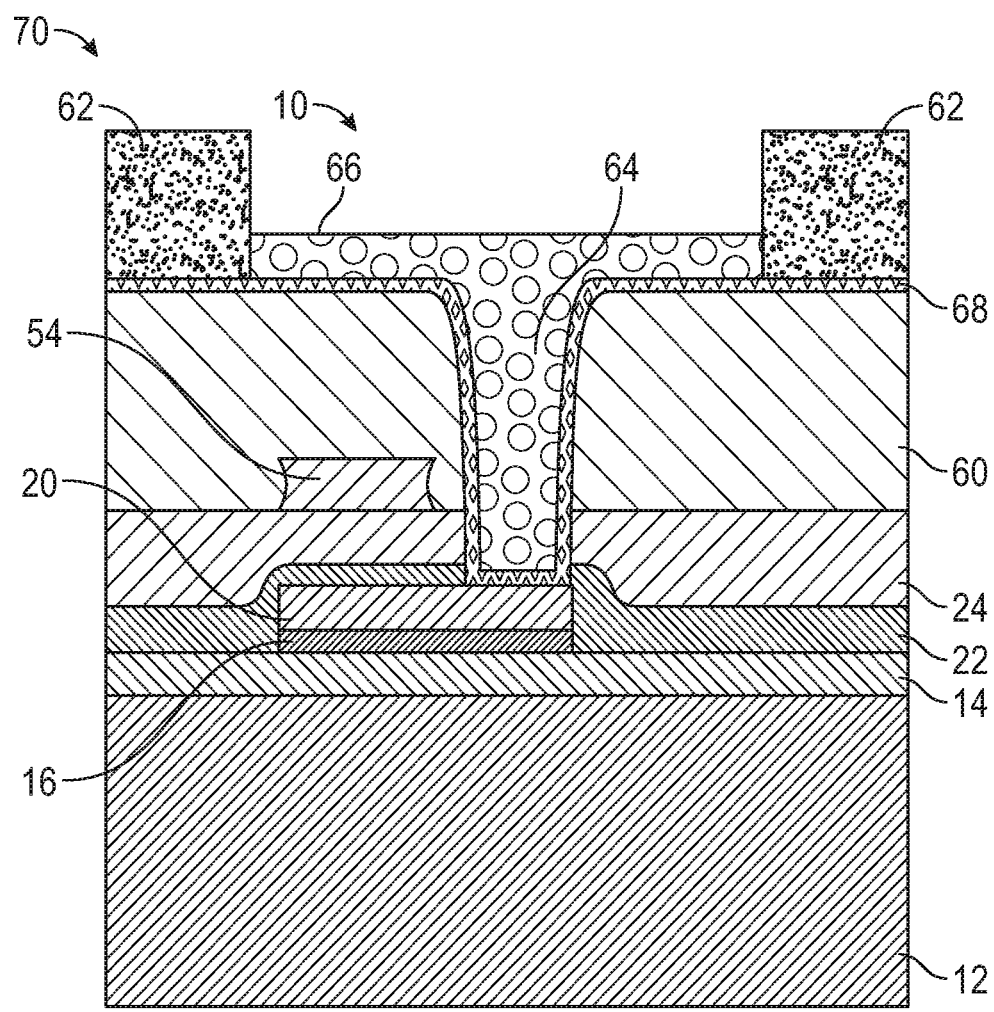

Referring to an exemplary embodiment in FIG. 8, with continuing reference to FIG. 7, the via 30 is filled with a liner layer 68, where the liner layer 68 also extends over the interlayer dielectric layer 60. In an exemplary embodiment, the liner layer 68 functions as a seed, and is comparable to the seed layer 16 described above. A contact photoresist layer 62 is formed and patterned overlying the liner layer 68, where the contact photoresist layer 62 is patterned to expose the via 30 and some of an upper surface of the interlayer dielectric layer 60 adjacent to the via 30.

Figure 9:
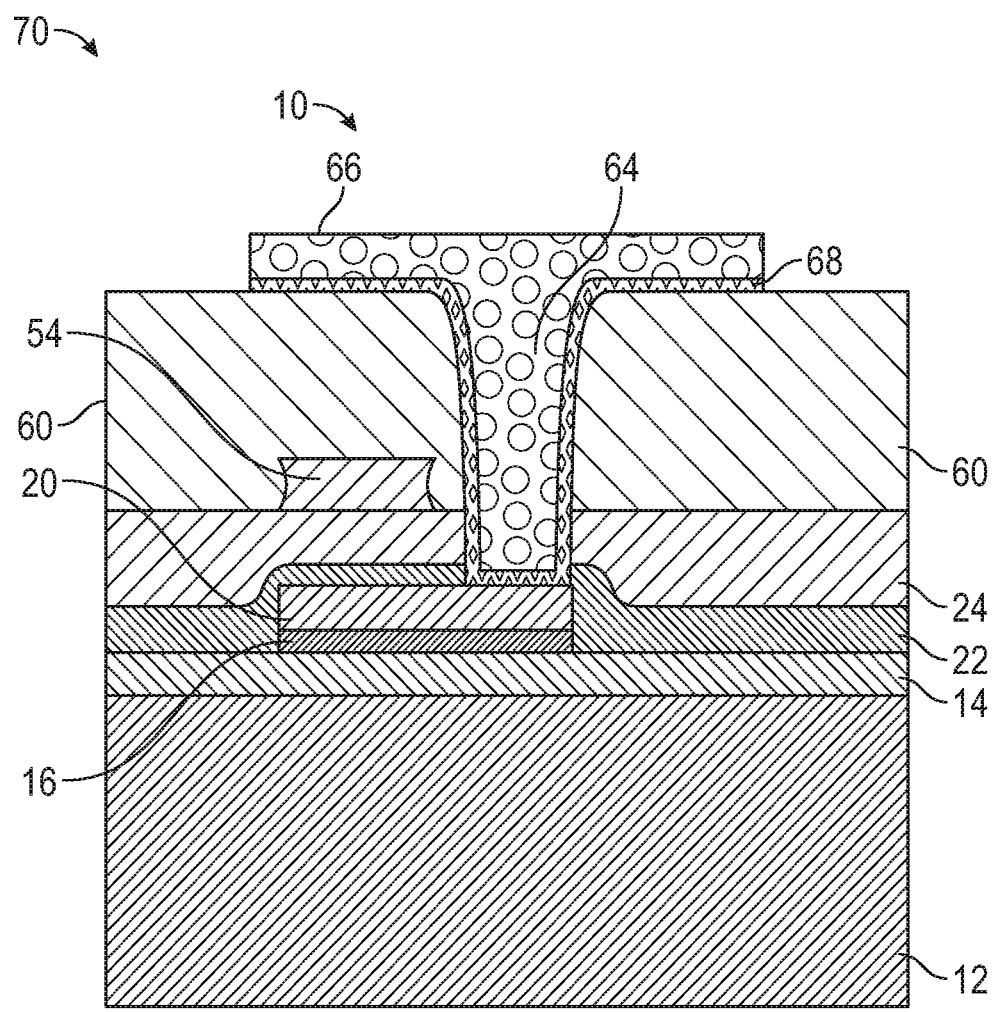

A contact 64 is formed in the via 30 and a top conductor element 66 is formed overlying the interlayer dielectric 60 adjacent to the contact 64, where the contact 64 and the top conductor element 66 may be formed as a single continuous component that is electrically conductive. The contact 64 extends to the lower conductor element 20, and is in electrical communication with the lower conductor element 20. The contact 64 and top conductor element 66 may include copper, where an exemplary deposition process is described above. The top conductor element 66 does not adhere to the contact photoresist layer 62, so the top conductor element 66 is positioned by the patterning of the contact photoresist layer 62. The contact photoresist layer 62 and the liner layer 68 underlying the contact photoresist layer 62 may be removed after use, as illustrated in FIG. 9, as described above for the seed layer 16 and the lower conductor photoresist layer 18 described and illustrated above in FIG. 1. In exemplary embodiments, there may be a plurality of top and lower conductor elements 66, 20 all electrically connected by a plurality of contacts 64 to form a coil 70 that wraps around the magnetic core 54, although the coil 70 and a plurality of the components thereof are not illustrated in detail for simplicity sake. Current can then be directed through the coil 70 to produce a magnetic field from the magnetic core 54.

The wet etchant 52 described above allows for an etch of the magnetic stack layer 40 that is selective to the magnetic stack layer 40 and that is tuned to etch the magnetic stack layer 40 in a time frame suitable for mass production manufacturing cycle times. This allows for mass production of an on-chip electro-magnet with integrated circuits.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit, the method comprising:
    forming a lower conductor element overlying a substrate;
    forming a magnetic stack layer overlying the lower conductor element; and
    removing a waste portion of the magnetic stack layer with a wet etchant to produce a magnetic core,
    wherein the wet etchant comprises hydrofluoric acid, a second acid different than the hydrofluoric acid, an oxidizer, and a solvent, the wet etchant has a hydrofluoric/solvent ratio representing a ratio of a weight of the hydrofluoric acid to a weight of the solvent in the wet etchant, the hydrofluoric/solvent ratio is from 1:10 to 1:200, the wet etchant has an oxidizer ratio representing a ratio of a sum of a weight of the second acid and the oxidizer to the weight of the solvent in the wet etchant, and the oxidizer ratio is from 2:5 to 2:100.

2. The method of claim 1 wherein forming the magnetic stack layer overlying the lower conductor element comprises:
    forming at least four magnetic sub-layers, wherein each of the at least four magnetic sub-layers comprises cobalt, zirconium, and tantalum; and
    forming at least four interface layers,
    wherein the at least four interface layers and the at least four magnetic sub-layers alternate in the magnetic stack layer, and each of the at least four interface layers comprises an interface layer material selected from silicon dioxide, aluminum nitride, cobalt oxide, or a combination thereof.

3. The method of claim 1 wherein the second acid is selected from the group consisting of hydrochloric acid, sulfuric acid, and combinations thereof.

4. The method of claim 3 wherein the oxidizer is selected from the group of consisting hydrogen peroxide, nitric acid, and a combination thereof.

5. The method of claim 4 wherein the solvent is selected from the group consisting of water, methanol, ethanol, propanol, butanol, pentanol, ethylene glycol, propylene glycol, and combinations thereof.

6. The method of claim 1 wherein the hydrofluoric/solvent ratio is from 1:50 to 1:150, and the oxidizer ratio is from 1:5 to 4:100.

7. The method of claim 1 wherein the hydrofluoric/solvent ratio is from 1:80 to 1:120, and the oxidizer ratio is from 6:100 to 1:10.

8. The method of claim 1 further comprising:
forming a base dielectric layer between the lower conductor element and the magnetic stack layer,
wherein the base dielectric layer comprises an organic compound, and the base dielectric layer survives removing the waste portion of the magnetic stack layer.

9. A method of producing an integrated circuit, the method comprising:
forming a lower conductor element overlying a substrate;
forming a magnetic stack layer overlying the lower conductor element; and
removing a waste portion of the magnetic stack layer with a wet etchant to produce a magnetic core,
wherein the wet etchant comprises hydrofluoric acid, a second acid different than the hydrofluoric acid, an oxidizer, and a solvent, the second acid is hydrochloric acid, the oxidizer is hydrogen peroxide, the wet etchant has a hydrofluoric/solvent ratio representing a ratio of a weight of the hydrofluoric acid to a weight of the solvent in the wet etchant, the hydrofluoric/solvent ratio is from 1:50 to 1:150, the wet etchant has an oxidizer ratio representing a ratio of a sum of a weight of the second acid and the oxidizer to the weight of the solvent in the wet etchant, and the oxidizer ratio is from 1:5 to 4:100.

10. The method of claim 9 wherein the solvent is selected from the group consisting of water, methanol, ethanol, propanol, butanol, pentanol, ethylene glycol, propylene glycol, and combinations thereof.

11. The method of claim 9 wherein forming the magnetic stack layer overlying the lower conductor element comprises:
forming at least four magnetic sub-layers, wherein each of the at least four magnetic sub-layers comprises cobalt, zirconium, and tantalum; and
forming at least four interface layers,
wherein the at least four interface layers and the at least four magnetic sub-layers alternate in the magnetic stack layer, and each of the interface layers comprises an interface layer material selected from silicon dioxide, aluminum nitride, cobalt oxide, or a combination thereof.

12. The method of claim 9 further comprising:
forming a base dielectric layer between the lower conductor element and the magnetic stack layer,
wherein the base dielectric layer comprises an organic compound, and the base dielectric layer survives removing the waste portion of the magnetic stack layer.

13. A method of producing an integrated circuit, the method comprising:
forming a lower conductor element overlying a substrate;
forming an etch stop layer overlying the lower conductor element;
forming a magnetic stack layer overlying the lower conductor element;
patterning a magnet photoresist layer overlying the magnetic stack layer; and
etching the magnetic stack layer by exposing the magnetic stack layer to a wet etchant in a single wet etch to selectively remove all of a waste portion of the magnetic stack layer to produce a magnetic core,
wherein the magnetic core underlies the magnet photoresist layer, the magnet photoresist layer and the etch stop layer survive the etching of the magnetic stack layer, the wet etchant comprises hydrofluoric acid, a second acid different than the hydrofluoric acid, an oxidizer, and a solvent, the second acid is selected from the group consisting of hydrochloric acid, sulfuric acid, and a combination thereof, the oxidizer is selected from the group consisting of hydrogen peroxide, nitric acid, and a combination thereof, the solvent is selected from the group consisting of water, methanol, ethanol, propanol, butanol, pentanol, ethylene glycol, propylene glycol, and combinations thereof, the wet etchant has a hydrofluoric/solvent ratio representing a ratio of a weight of the hydrofluoric acid to a weight of the solvent in the wet etchant, the hydrofluoric/solvent ratio is from about 1:10 to 1:200, the wet etchant has an oxidizer ratio representing a ratio of a sum of a weight of the second acid and the oxidizer to the weight of the solvent in the wet etchant, and the oxidizer ratio is from 2:5 to 2:100.

14. The method of claim 13 further comprising:
forming a base dielectric layer between the lower conductor element and the magnetic stack layer,
wherein the base dielectric layer primarily comprises an organic compound, and the base dielectric layer survives the etching of the magnetic stack layer.

15. The method of claim 13 further comprising:
forming a glue layer directly underlying the magnetic stack layer, wherein the glue layer primarily comprises titanium.

16. The method of claim 15 wherein etching the magnetic stack layer comprises:
etching the glue layer that directly underlies the waste portion of the magnetic stack layer.

17. The method of claim 13 wherein forming the magnetic stack layer comprises:
alternately forming a magnetic sub-layer and an interface layer,
wherein the magnetic sub-layer comprises cobalt, zirconium, and tantalum, and the interface layer comprises an interface layer material selected from silicon dioxide, aluminum nitride, cobalt oxide, or a combination thereof.

18. The method of claim 17 wherein forming the magnetic stack layer comprises forming from 4 to 24 of the magnetic sub-layers, and forming the interface layer comprises forming from 4 to 24 of the interface layers.

* * * * *